United States Patent
Lee

[19]

[11] Patent Number: 6,078,093
[45] Date of Patent: *Jun. 20, 2000

[54] CAPACITOR STRUCTURE OF SEMICONDUCTOR DEVICE FOR HIGH DIELECTRIC CONSTANT

[75] Inventor: Chang Jae Lee, Chungcheongbuk-do, Rep. of Korea

[73] Assignee: LG Semicon Co., Ltd., Chungcheongbuk-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/961,070

[22] Filed: Oct. 30, 1997

Related U.S. Application Data

[62] Division of application No. 08/698,520, Aug. 15, 1996, Pat. No. 5,741,722.

[30] Foreign Application Priority Data

Apr. 12, 1996 [KR] Rep. of Korea ............... 96-11066

[51] Int. Cl.$^7$ ............................................. H01L 29/00
[52] U.S. Cl. ..................... 257/532; 257/295; 257/306; 257/310
[58] Field of Search ................. 257/306, 298, 257/295, 310, 532; 438/396, 397

[56] References Cited

U.S. PATENT DOCUMENTS

| | | | |
|---|---|---|---|
| 5,108,943 | 4/1992 | Sandhu et al. | 438/397 |
| 5,150,276 | 9/1992 | Gonzalez et al. | 257/296 |
| 5,291,058 | 3/1994 | Samata et al. | 257/641 |
| 5,460,996 | 10/1995 | Ryou | 438/397 |
| 5,555,486 | 9/1996 | Kingon et al. | 257/306 |
| 5,581,110 | 12/1996 | Razouk et al. | 257/641 |
| 5,604,696 | 2/1997 | Takaishi | 257/303 |

*Primary Examiner*—J. Carroll
*Attorney, Agent, or Firm*—Morgan, Lewis & Bockius LLP

[57] ABSTRACT

A semiconductor device capacitor structure comprises a semiconductor substrate having an impurity diffusion region; an insulating layer formed on the semiconductor substrate and having a contact hole on the impurity diffusion region; a first lower electrode of a half ring type formed on the insulating film along an upper edge of the contact hole; a second lower electrode formed on a surface of the substrate exposed through the contact hole, a wall of the contact hole, and the first lower electrode; a dielectric layer formed on the first and second lower electrodes; and an upper electrode formed on the dielectric layer. This structure increases capacitance, thereby improving the characteristics and reliability of the device.

15 Claims, 13 Drawing Sheets

CAPACITOR STRUCTURE OF SEMICONDUCTOR DEVICE FOR HIGH DIELECTRIC CONSTANT

This is a divisional of application Ser. No. 08/698,520 filed on Aug. 15, 1996, U.S. Pat. No. 5,741,722.

BACKGROUND OF THE INVENTION

1. Field of the Invention

The present invention relates to a semiconductor device and, more particularly, to the structure of a capacitor of a semiconductor device and a method for manufacturing the same. These are suited to enhance the characteristics and reliability of a semiconductor device by increasing the capacitance in a highly integrated device such as a dynamic random access memory device (DRAM).

2. Discussion of the Related Art

In general, a DRAM has a simple structure in which each cell includes one transistor and one capacitor. Such a structure is profitable in that it provides for large capacitance at a low cost.

Accordingly, DRAMs are widely used for various kinds of electronic products, including computers, and the application range thereof is continuously expanding.

At the present time, 16 Mb DRAMs and 64 Mb DRAMs are in mass production. 256 Mb DRAMs and 1 Gb DRAMs, on the other hand, are in an earlier stage of development.

As the integration of DRAMs increases, the capacitor area in the cell area rapidly decreases. Therefore, techniques of manufacturing a capacitor which obtain the same capacitance in a reduced area are emerging as one of the most important areas for enhancing the integration of DRAMs.

Hereinafter, a capacitor of a general DRAM will be described with reference to the attached drawings.

Figure 1A:
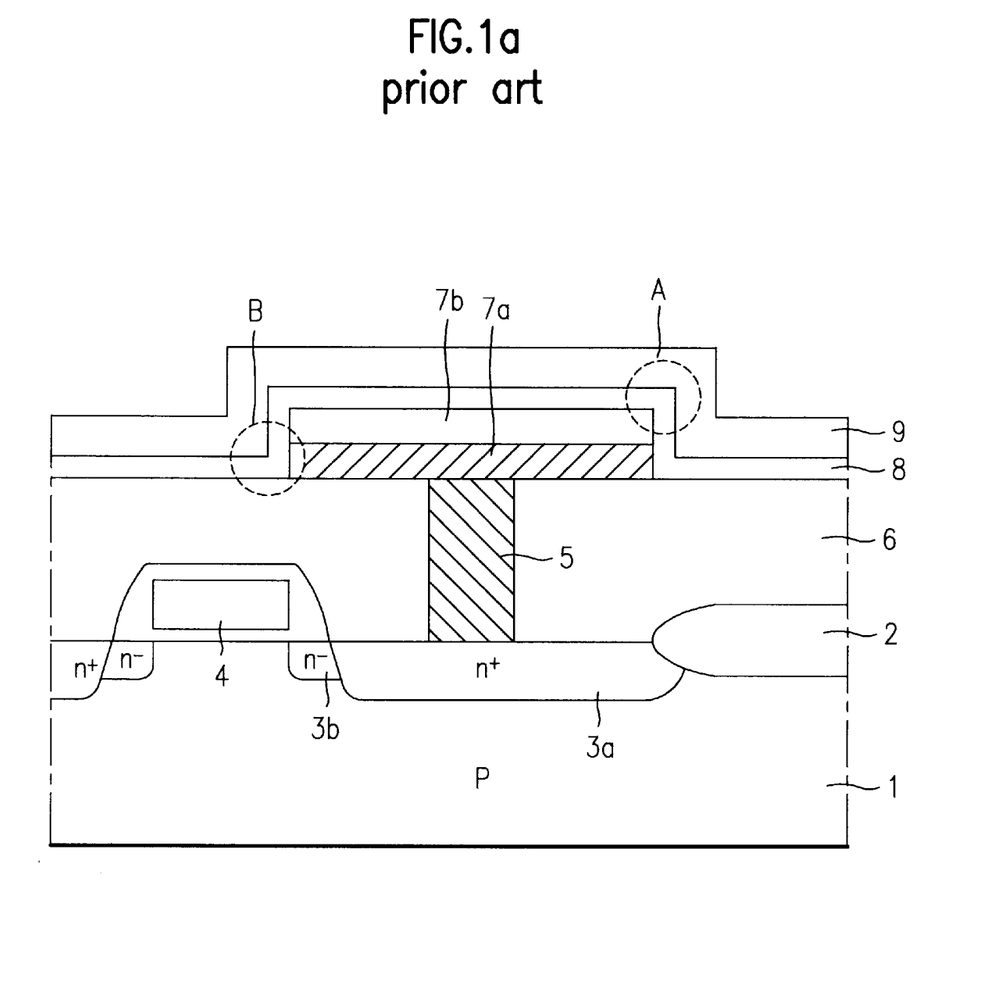
FIGS. 1a and 1b are cross-sectional views showing the structure of a general capacitor having a high dielectric film.
Figure 1B:
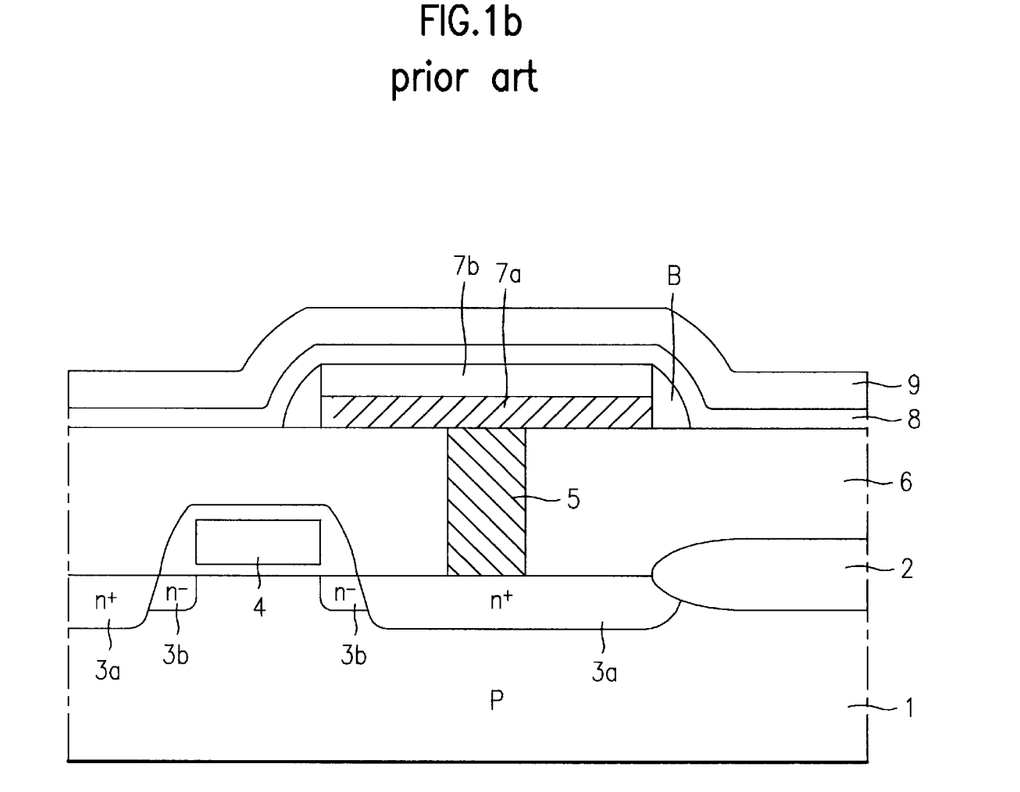

FIGS. 1a and 1b are cross-sectional views showing the structure of a general capacitor having a high dielectric film.

Generally, in manufacturing a capacitor, studies with respect to usage of materials having a high dielectric constant, such as $BaSrTiO_3$(BST), $BaTiO_3$, $SrTiO_3$, and $PbZrO_3$, have been actively proceeding. However, in case of using these materials with a high dielectric constant as a dielectric film of a capacitor, the following restrictions apply.

First, if a polysilicon is used as a storage node electrode (lower electrode), an interface oxide film is formed between the electrode and the high dielectric film. This will have an adverse effect on the utility of the device. Further, since the depositing of the high dielectric film is performed at a high temperature of 600–700° C., materials having a high melting point and a non-oxidizing characteristic have to be used to form the electrode.

Accordingly, manufacturing a capacitor by using a high dielectric material needs improvement both in the structure of the storage node electrode and in the development of the process therewith.

In other words, when using a polysilicon electrode, an electrode of a multi-layer structure in which a barrier layer is formed should be adopted to prevent the formation of the interface oxide film between the dielectric film and the electrode.

Further, in order to form the electrode by using materials such as Pt, Pd, Rh, and Ru, etc., the development of the etching process should be preceded. But at present, this method does not yield successful results.

FIG. 1a shows a typical capacitor having a high dielectric film. An example of this is disclosed in IEDM'91, "A Stacked Capacitor With $(Ba_xSr_{1-x})TiO_3$ for 256 M DRAM," by Koyanma et al., pp. 823–826.

With reference to FIG. 1a, a field oxide film 2 is formed on a device-isolating region of a semiconductor substrate 1. Impurity diffusion regions 3a and 3b having an LDD (lightly doped drain) structure are formed in the semiconductor substrate 1 on both sides of a gate electrode 4 formed on an active region. Through a contact hole of an interlayer insulating film 6 formed on the entire surface of the semiconductor substrate, a plug 5 for connecting impurity diffusion regions 3a and 3b with an upper electrode is formed. A barrier metal layer 7a consisting of TiN is formed to a predetermined width on a portion of the interlayer insulating film 6 including the plug 5. A lower electrode 7b consisting of Pt is formed on the barrier metal layer 7a. A high dielectric film 8 consisting of BST is formed over the entire surface of the capacitor area. An upper electrode 9 consisting of Pt is formed on the high dielectric film 8, thereby finishing the capacitor.

In the aforementioned capacitor having the high dielectric film, poor step coverage at a bent part (A) of the high dielectric film 8 consisting of BST can cause a leakage current.

At a part (B) where the barrier metal layer 7a is exposed, when depositing the high dielectric film 8 consisting of BST, the barrier metal layer 7a consisting of TiN or Ta is oxidized to increase a contact resistance. Further, the adhesion of the barrier metal layer 7a and the lower electrode 7b is weakened, so that lower electrode 7b may be inclined to be lifted.

In order to counter the aforementioned disadvantages of the capacitor having the high dielectric film, a suggested structure is shown in FIG. 1b.

FIG. 1b shows the structure of a capacitor corresponding to that disclosed in U.S. Pat. No. 5,335,138. A field oxide film 2 is formed on a device-isolating region of a semiconductor substrate 1. Impurity diffusion regions 3a and 3b having an LDD (lightly doped drain) structure are formed in the semiconductor substrate 1 on both sides of a gate electrode 4 formed on an active region. Through a contact hole of an interlayer insulating film 6 formed on the entire surface of the semiconductor substrate, a plug 5 for connecting impurity diffusion regions 3a and 3b with an upper electrode is formed. A barrier metal layer 7a consisting of TiN is formed to a predetermined width on the interlayer insulating film 6 including the plug 5. A lower electrode 7b consisting of Pt is formed on the barrier metal layer 7a. A conductive sidewall 10 is formed on the side of the barrier metal layer 7a and the lower electrode 7b. A high dielectric film 8 consisting of BST is formed on the entire surface of a capacitor area. An upper electrode 9 consisting of Pt is formed on the high dielectric film 8, thereby finishing the capacitor.

In the above capacitor structure, the conductive sidewall 10 is formed on the side of the barrier metal layer 7a and the lower electrode 7b for solving the problems of the increase in the leakage current and the oxidization of the barrier metal layer. The conductive sidewall 10 may be formed of conductive materials such as silicon nitride.

In the capacitor having the high dielectric film as described above, the high dielectric film should be deposited to a proper thickness to solve the problem of the leakage current caused due to the poor step coverage of the conductive sidewall 10. As a result of this, however, the effective capacitance of the capacitor is decreased because the capacitance of the main surface decreases as the thickness of the dielectric film of the top surface of the electrode increases.

In addition to the aforementioned problem, the above conventional capacitor having the high dielectric film has a simple s tack-type structure. Thus, it is difficult to obtain the capacitance required for a unit cell in the capacitor forming region which is reduced according to the increase in the integration of memory devices.

SUMMARY OF THE INVENTION

Accordingly, the present invention is directed to a capacitor structure of semiconductor device and a method for manufacturing the same that substantially obviates one or more of the problems due to limitations and disadvantages of the related art.

It is an object of the present invention to provide a capacitor structure of a semiconductor device and a method for manufacturing the same, which are suited to enhance the characteristics and reliability of the semiconductor device by increasing a capacitance in a highly integrated device such as a DRAM.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the capacitor structure of a semiconductor device of the present invention includes a semiconductor substrate having an impurity diffusion region; an insulating layer formed on the semiconductor substrate and having a contact hole on the impurity diffusion region; a first lower electrode of a half ring type formed on the insulating film along an upper edge of the contact hole; a second lower electrode formed on a surface of the substrate exposed through the contact hole, a wall of the contact hole, and the first lower electrode; a dielectric layer formed on the first and second lower electrodes; and an upper electrode formed on the dielectric layer.

In another aspect, the method of manufacturing a capacitor structure of a semiconductor device includes the steps of: forming a gate electrode and a gate sidewall on a semiconductor substrate in which a field oxide film is formed on a device isolating region; forming impurity diffusion regions having an LDD structure in the semiconductor substrate on different sides of the gate electrode; forming first, second, third, and fourth insulating layers over the semiconductor substrate, coating and patterning a photoresist over the insulating layers, and sequentially etching the fourth insulating layer, the third insulating layer, and the second insulating layer to thereby form a contact hole in the fourth, third, and second insulating layers; forming a first electrode material layer over the semiconductor substrate and anisotropically etching the first electrode material layer so as to leave only a portion of the first electrode material on a wall of the contact hole, the portion of the first electrode material on the wall of the contact hole forming a first conductive sidewall; removing a portion of the first insulating layer located below the contract hole by using the first conductive sidewall as a mask, and forming a second electrode material layer over the semiconductor substrate, a plurality of the insulating layers, and the first conductive sidewall; forming a planarizing layer over a surface of the semiconductor substrate over which the second electrode material layer is formed, and etching back the planarizing layer until the second electrode material layer is exposed; removing an exposed portion of the second electrode material layer and at least a portion of the third insulating layer, and forming a third electrode material layer to a predetermined thickness over the semiconductor substrate; anisotropically etching the third electrode material layer to thereby form a second conductive sidewall on a side of the first conductive sidewall; removing a portion of the planarizing layer remaining in the contact hole and forming a dielectric layer over the semiconductor substrate; and forming an upper electrode of a capacitor on the dielectric layer.

In a further aspect, the capacitor structure of a semiconductor device includes: a semiconductor substrate; an impurity diffusion region formed in the semiconductor substrate; an insulating layer formed over the semiconductor substrate and having a contact hole formed therein over the impurity diffusion region; a lower electrode, at least a portion of the lower electrode being formed in the contact hole of the insulating layer; a dielectric layer formed over the lower electrode; and an upper electrode formed on the dielectric layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 2A:
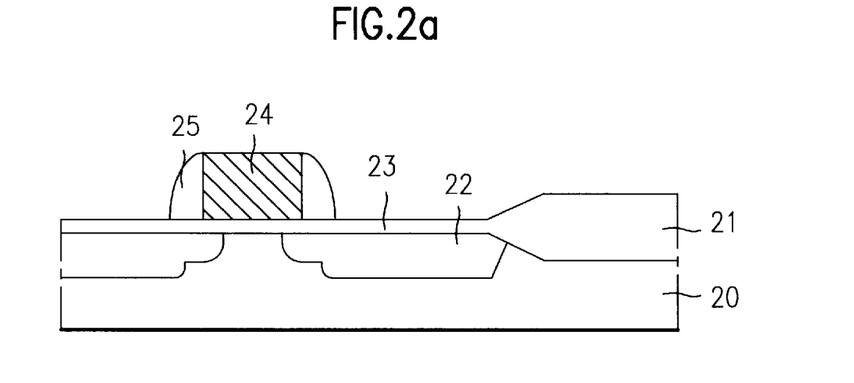
FIGS. 2a to 2n are cross-sectional views illustrating a method for manufacturing a capacitor having a high dielectric film, according to a first embodiment of the present invention.
Figure 2B:
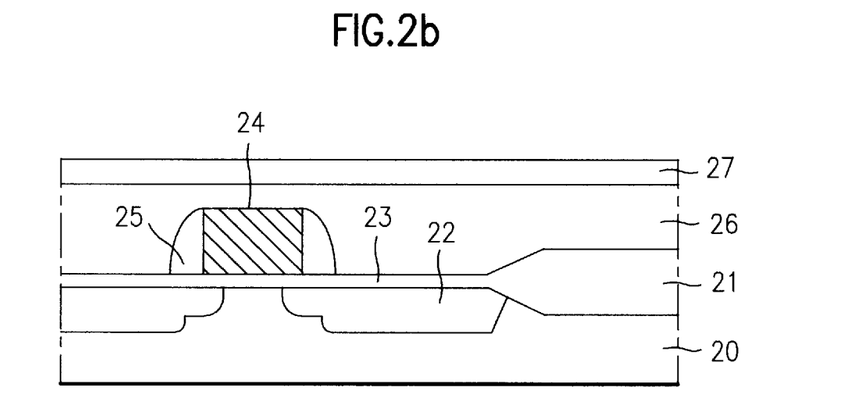
Figure 2C:
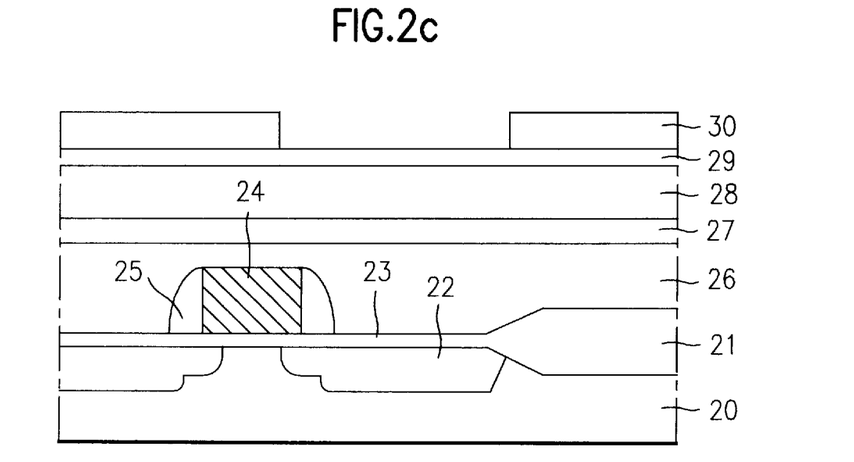
Figure 2D:
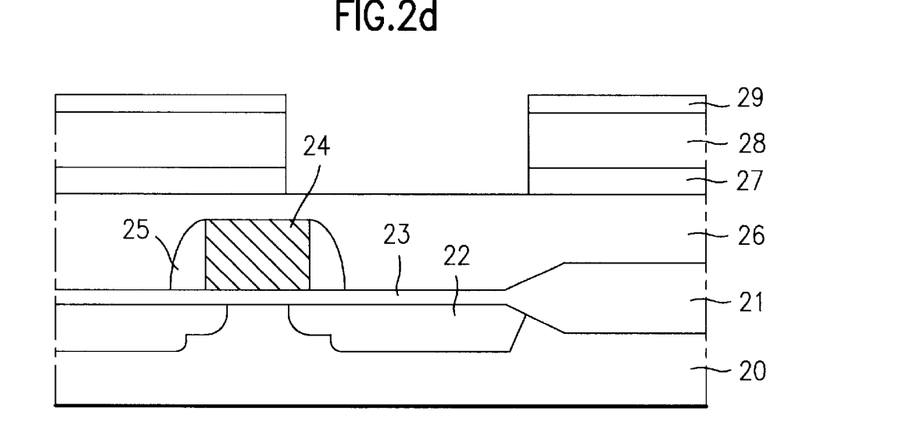
Figure 2E:
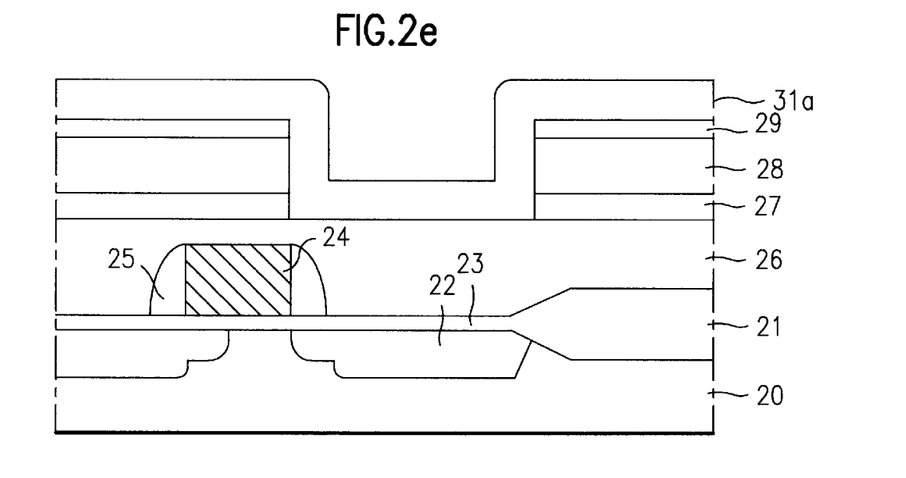
Figure 2F:
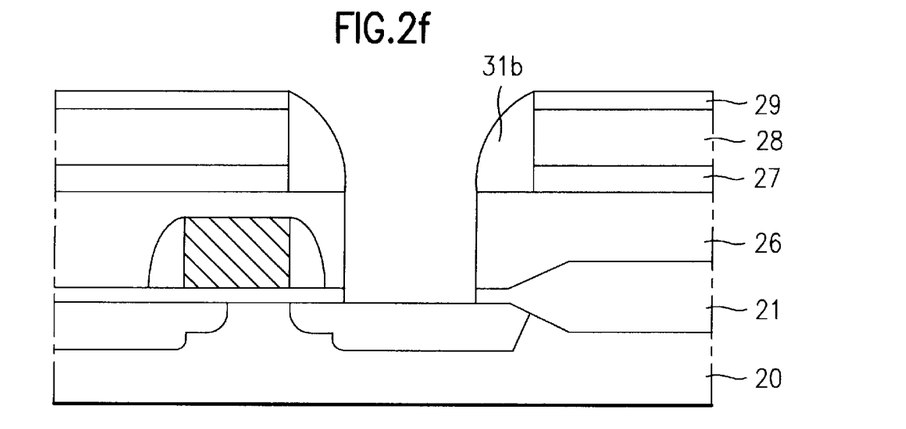
Figure 2G:
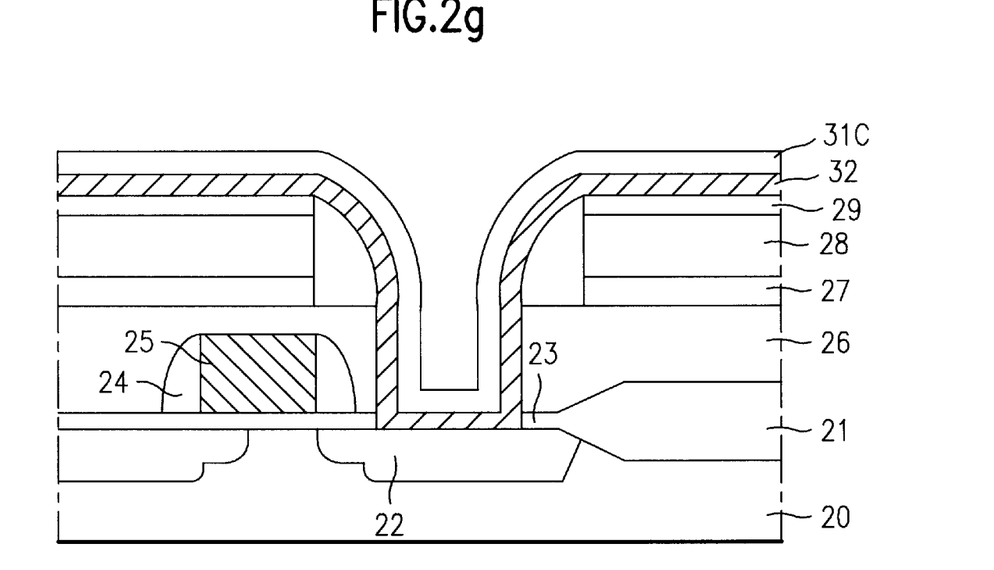
Figure 2H:
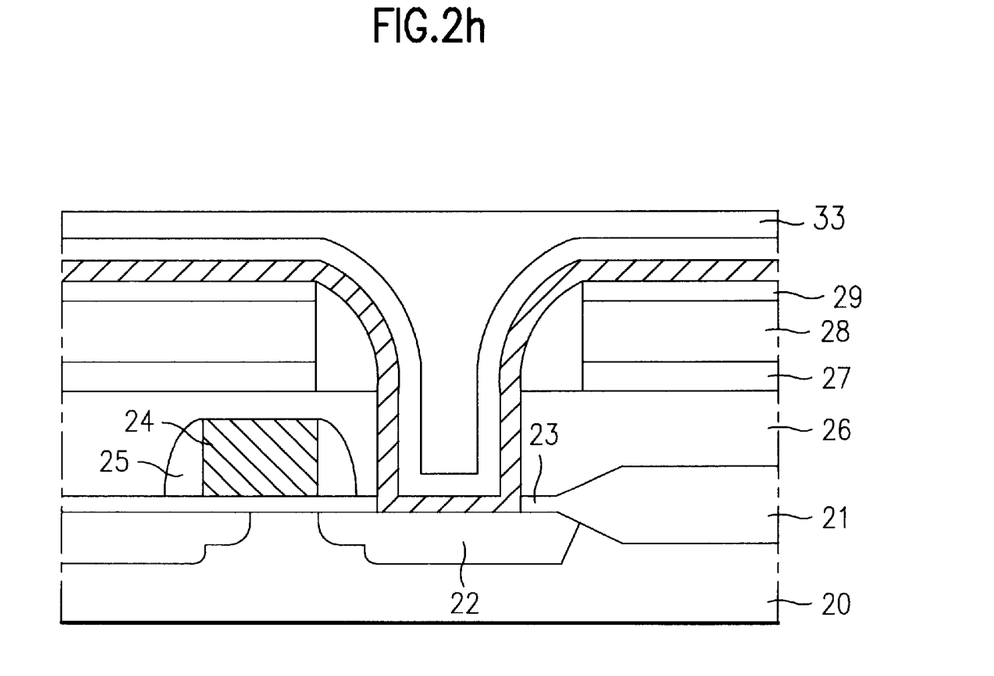
Figure 2I:
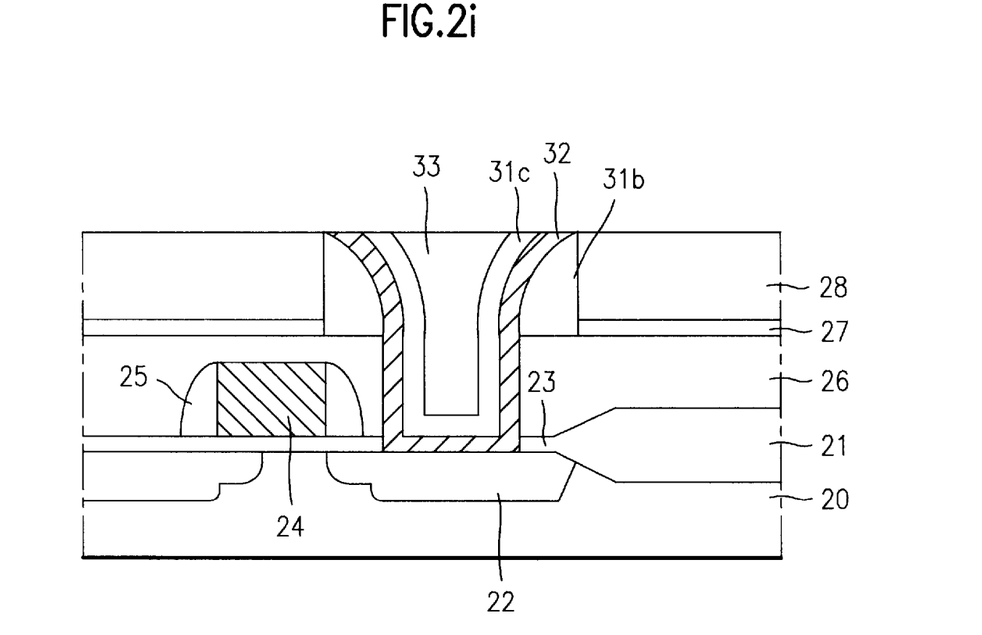
Figure 2J:
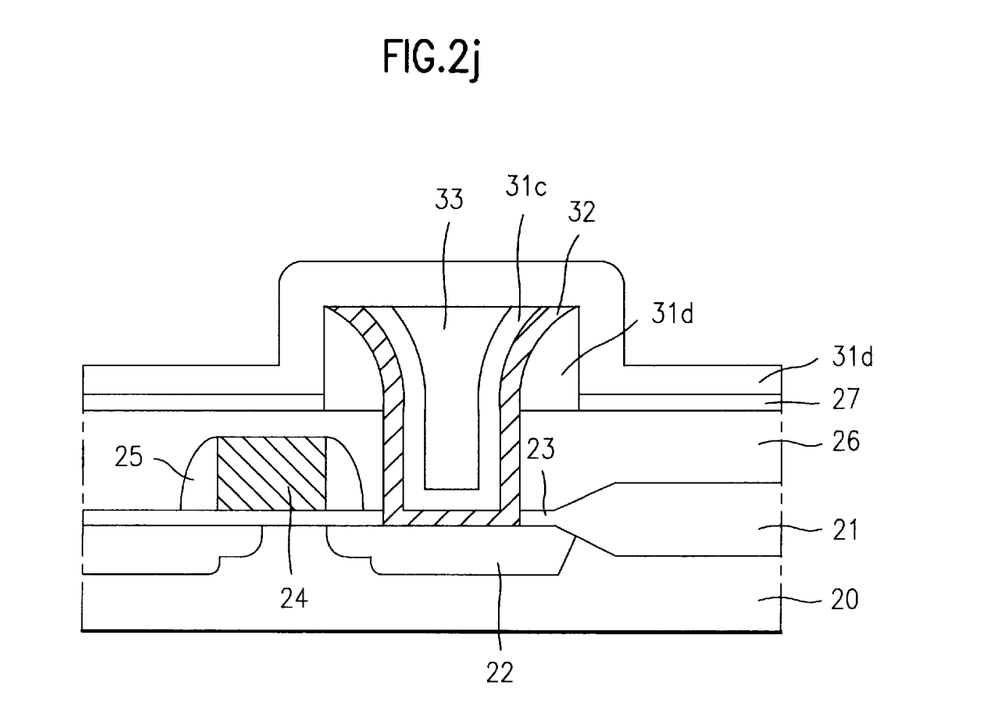
Figure 2K:
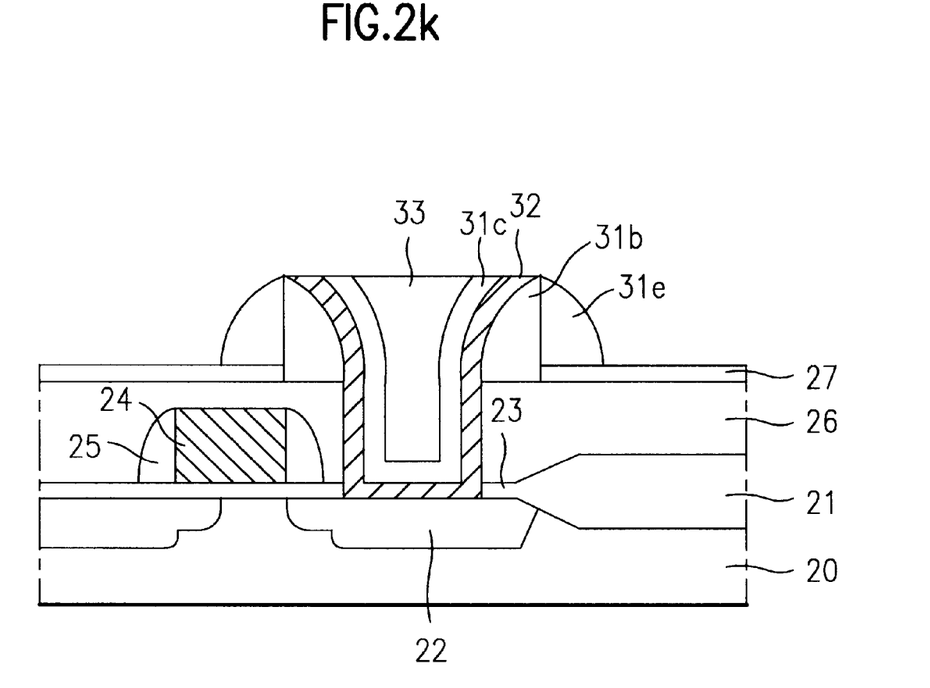
Figure 2L:
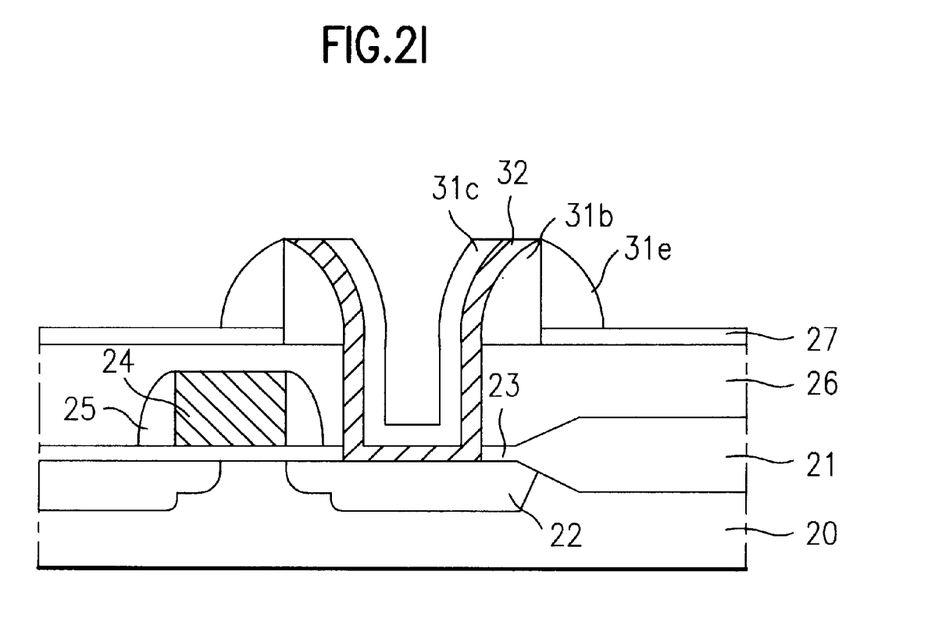
Figure 2M:
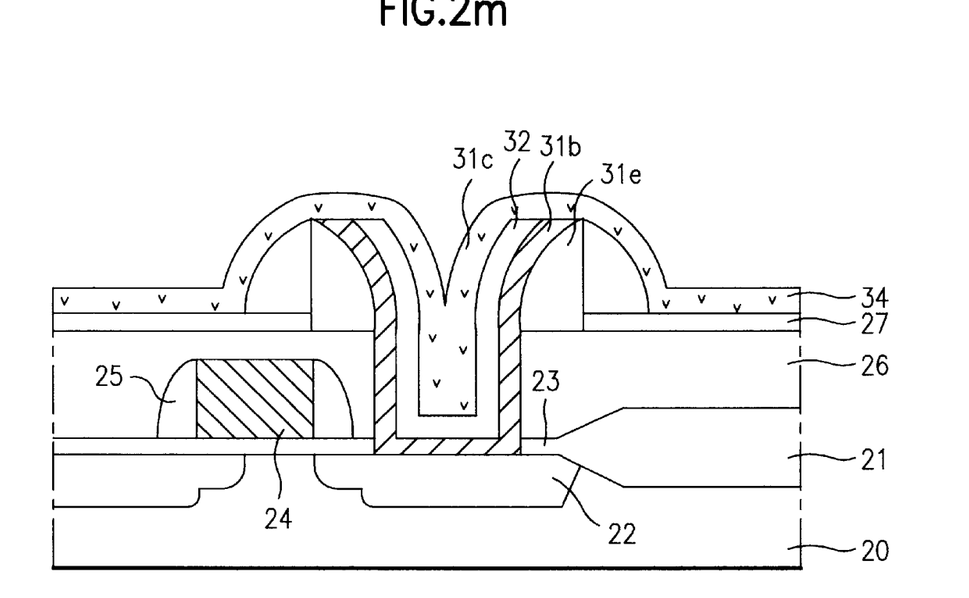
Figure 2N:
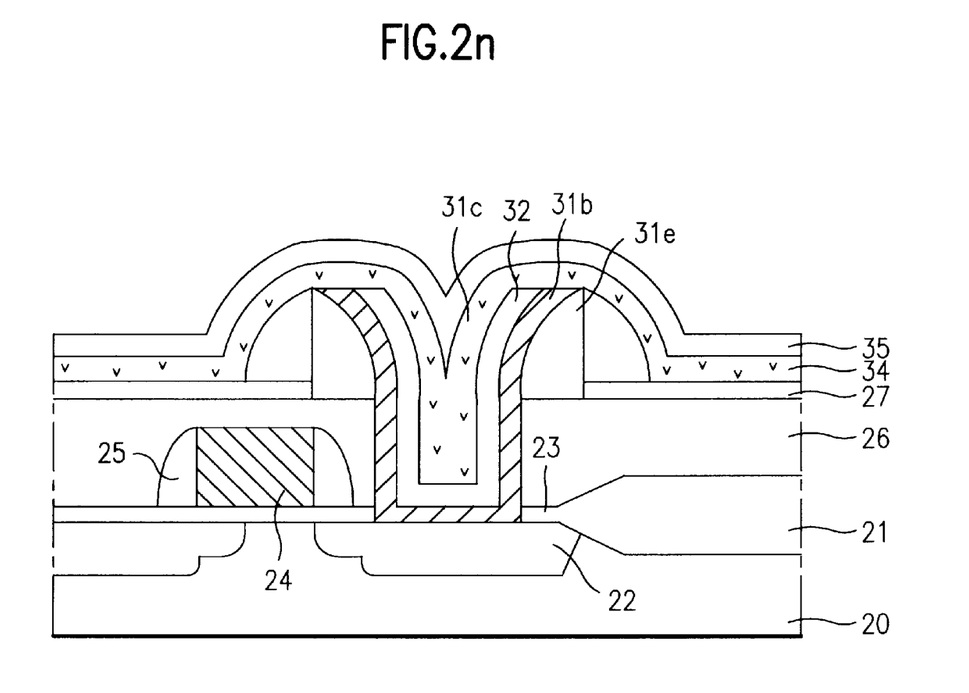

FIGS. 2a to 2n are cross-sectional views illustrating a method for manufacturing a capacitor having a high dielectric film (i.e., a dielectric film having a high dielectric constant), according to a first embodiment of the present invention.

Referring to FIG. 2n, in a capacitor having a high dielectric film according to the present invention, a field oxide film 21 is formed on a device isolating region of a semiconductor substrate 20. A gate insulating film 23 and a gate electrode 24 are formed on an active region of the semiconductor substrate 20. Impurity diffusion regions 22 having an LDD (lightly doped drain) structure are formed in the semiconductor substrate 20 on both sides of the gate electrode 24. A first insulating layer 26 having a contact hole on the impurity diffusion region 22 is formed to a thickness of about 3000 Å on the entire surface of the semiconductor substrate 20. A second insulating layer 27 is formed to a thickness of about 300 Å on the first insulating layer 26, and has a wider expansion region than the contact hole. A first conductive sidewall 31b consisting of a material such as Pt or $RuO_2$ is formed on the first insulating layer 26 of the expansion region. A barrier metal layer 32 consisting of a material such as TiN, and having a thickness of 500–1000 Å, is formed on the contact hole including the first conductive sidewall 31b, so as to be in contact with the impurity diffusion region 22. A second electrode material layer 31c consisting of a material such as Pt or $RuO_2$ is formed to a thickness of 500–1000 Å on the barrier metal layer 32. A second conductive sidewall 31e consisting of a material such as Pt or $RuO_2$ and having a predetermined width is formed on the second insulating layer 27 on the opposite side of the first conductive sidewall 31b. A high dielectric film 34 consisting of a material having a high dielectric constant, such as BST, is formed on the entire surface of the structure including a lower electrode consisting of the first and second conductive sidewalls 31b and 31e and the second electrode material layer 31c. As shown in FIG. 2n, the lower electrode including the first and second conductive sidewalls 31b and 31e has a hemispherical shape in a cross-sectional view perpendicular to the semiconductor substrate 20. An upper electrode 35 consisting of Pt, W or $RuO_2$ is formed on the high dielectric film 34. The first insulating layer 26 may be formed of $SiO_2$ and the second insulating layer may be formed of $Si_3N_4$.

The manufacturing process of the above capacitor having the high dielectric film of the present invention is as follows.

To begin with, as shown in FIG. 2a, a gate electrode 24 and a gate sidewall 25 are formed on a gate insulating film 23 on a semiconductor substrate 20 in which a field oxide film 21 is formed on a device isolating region. Impurity diffusion regions 22 having an LDD (lightly doped drain) structure are formed in the semiconductor substrate 20 on both sides of the gate electrode 24.

As shown in FIG. 2b, a first insulating layer 26 is formed to a thickness of about 3000 Å on the entire surface of the structure, through a chemical vapor deposition (CVD) process. According to a low pressure chemical vapor deposition (LPCVD) process, $Si_3N_4$ is deposited to a thickness of about 300 Å on the first insulating layer 26, thereby forming a second insulating layer 27.

As shown in FIG. 2c, $SiO_2$ is coated to a thickness of about 4000 Å on the second insulating layer 27 through a CVD process, thereby forming a third insulating layer 28. According to a LPCVD process, $Si_3N_4$ is deposited to a thickness of about 300 Å on the third insulating layer 28, thereby forming a fourth insulating layer 29.

Then, a photoresist 30 is coated on the fourth insulating layer 29 and patterned, thereby defining a region where a storage node electrode of the capacitor will be formed.

As shown in FIG. 2d, using the patterned photoresist 30 as a mask, the fourth insulating layer 29, the third insulating layer 28, and the second insulating layer 27, are sequentially etched through a reactive ion etching (RIE) procedure using $CH_3/CF_4$, thereby forming a contact hole.

Then, the photoresist 30 is doped in $H_2O_2/H_2SO_4$ solution and, thus, removed.

As shown in FIG. 2e, Pt or $RuO_2$ is deposited to a thickness of about 1500–2000 Å on the entire surface of the capacitor region through a CVD process, thereby forming a first electrode material layer 31a.

At this time, the process of depositing Pt is carried out by pyrolyzing $Pt(PF_3)_4$ gas at a temperature of about 300° C. The process of depositing $RuO_2$ is carried out by reacting $Ru(DPM)_3$ and $O_3$ with each other.

As shown in FIG. 2f, the first electrode material layer 31a is anisotropically etched so as to be left only on the wall of the contact hole formed in the preceding process, thereby forming a first conductive sidewall 31b.

Using the first conductive sidewall 31b as a mask, the exposed first insulating layer 26 and the gate insulating film 23 are removed. The etching process is carried out through an inductively coupled plasma (ICP) method using a gas with a high carbon content such as $C_2F_6$ or $C_3H_8$ having a good etch selectivity with respect to the $SiO_2$ used as the first insulating layer 26 and the $Si_3N_4$ used as the second and fourth insulating layers 27 and 29.

As shown in FIG. 2g, in order to prevent the direct contact between Pt used as the electrode material and the semiconductor substrate 20, TiN having a good barrier characteristic is sputtered to a thickness of about 500–1000 Å according to a CVD process or a collimated sputtering process, thereby forming a barrier metal layer 32. In the case where $RuO_2$ is used as the electrode material, no barrier metal layer 32 is formed. Then, on the entire surface of the capacitor region, Pt or $RuO_2$ is deposited to a thickness of about 500–1000 Å, thereby forming a second electrode material layer 31c.

As shown in FIG. 2h, a spin on glass (SOG) or a photoresist is coated on the entire surface of the semiconductor substrate 20, thereby forming a planarizing layer 33.

As shown in FIG. 2i, through a chemical mechanical polishing (CMP) process or a reactive ion etching (RIE) process, the planarizing layer 33 is etched back until the second electrode material layer 31c is exposed. Then, through an additional etching process, the planarizing layer 33 is etched so as to expose the third insulating layer 28.

At this time, in the case where the planarizing layer 33 is formed of SOG, the RIE process is performed using $CHF_3/CF_4$. In case of forming planarizing layer 33 as a photoresist, a plasma etching using $O_2/Ar$ is carried out.

Then, the TiN used as the barrier metal layer 32 is etched using $BCl_3/Cl_2$ gas. The Pt used as the second electrode material layer 31c is etched using HBr gas.

According to the above etching process, the SOG or the photoresist is coated in the contact hole where the storage node electrode of the capacitor will be formed. The barrier metal layer 33 and the second electrode material layer 31c are removed from regions other than the aforementioned region.

As shown in FIG. 2j, the exposed third insulating layer 28 is removed through an etching process using HF gas. Pt or $RuO_2$ is deposited to a thickness of about 1000–2000 Å on the entire surface of the capacitor region through a CVD process, thereby forming a third electrode material layer 31d.

As shown in FIGS. 2k and 2l, the third electrode material layer 31d is anisotropically etched to form a second conductive sidewall 31e on the side of the first conductive sidewall 31b, thereby completing a lower electrode of the capacitor. As shown in FIG. 2n, the lower electrode including the first and second conductive sidewalls 31b and 31e has a hemispherical shape in a cross-sectional view perpendicular to the semiconductor substrate 20.

Then, the planarizing layer 33 consisting of the SOG or the photoresist left in the contact hole is removed.

As shown in FIG. 2m, through a CVD process or a sputtering process, a material having a high dielectric constant, such as BST which exists as an oxide type such that a single metal combines with an oxygen, or a composite oxide type such that these are included compositely, for example, $BaSrTiO_3$ (BST), $BaTiO_3$, $SrTiO_3$ and $PbZrO_3$, is deposited on the entire surface of the capacitor region, thereby forming a high dielectric film 34.

As shown in FIG. 2n, a material such as Pt, W or $RuO_2$ is deposited on the high dielectric film 34, thereby forming an upper electrode 35 of the capacitor.

Hereinafter, the structure of a capacitor and a method for manufacturing the same according to a second embodiment of the present invention will be described with reference to the attached drawings.

Figure 3A:
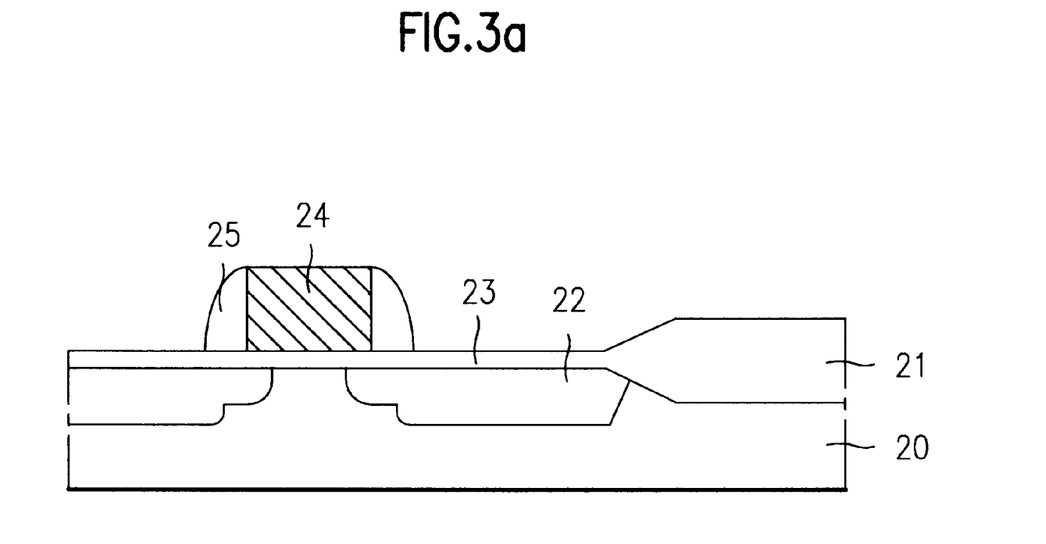
FIGS. 3a to 3n are cross-sectional views illustrating a method for manufacturing a capacitor having a high dielectric film, according to a second embodiment of the present invention.
Figure 3B:
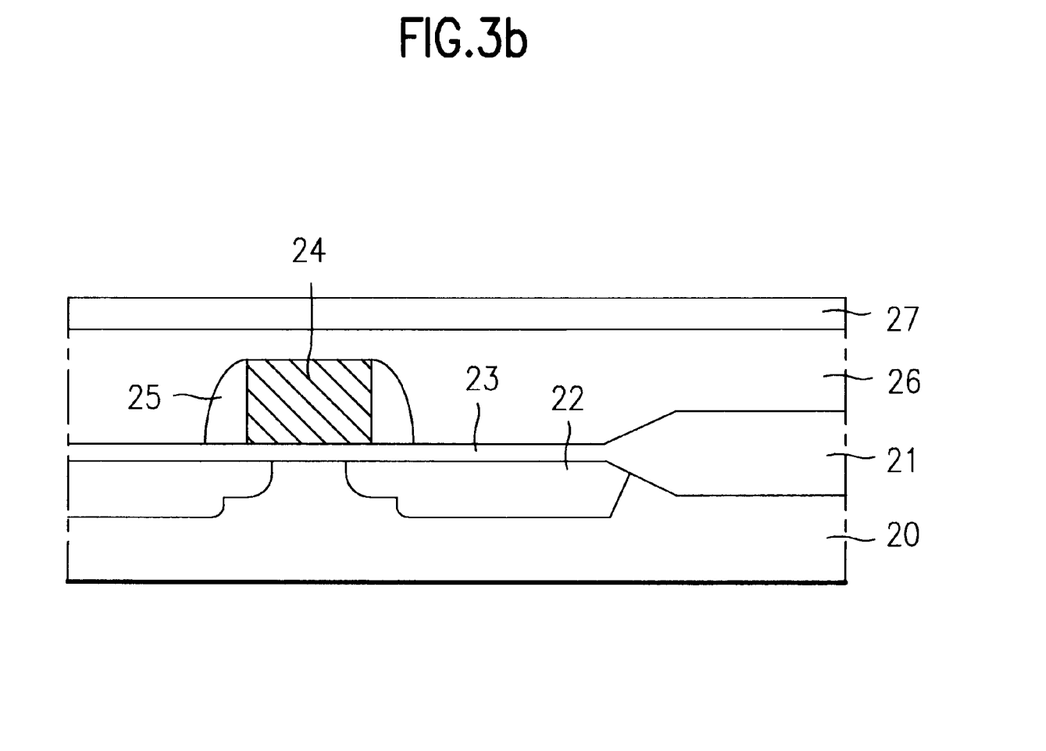
Figure 3C:
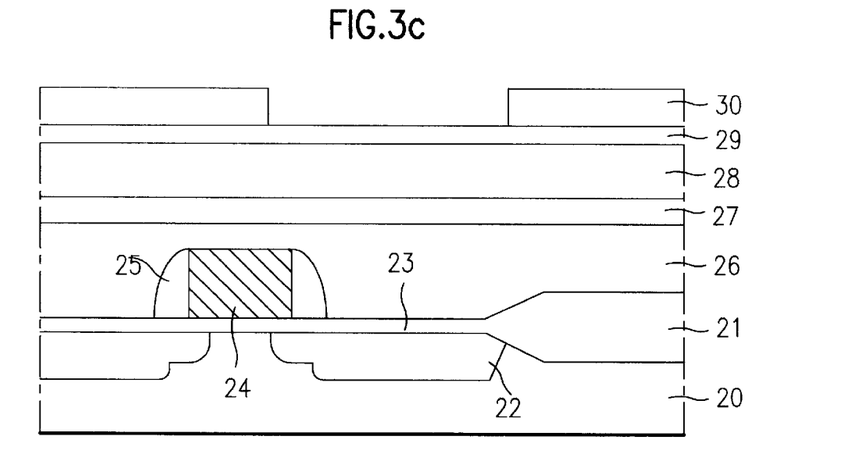
Figure 3D:
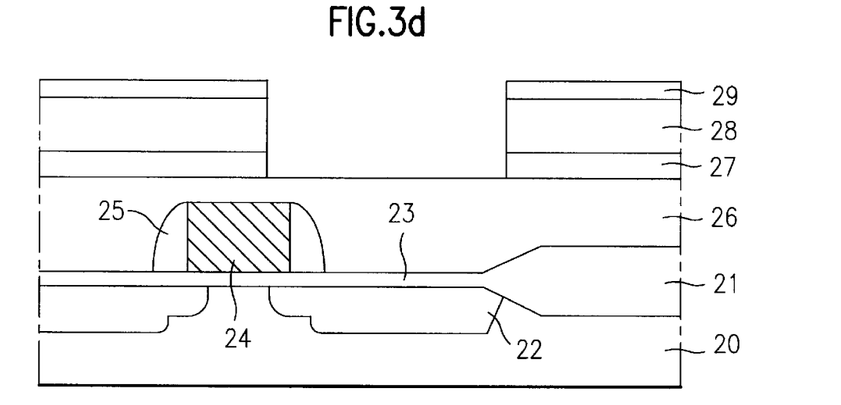
Figure 3E:
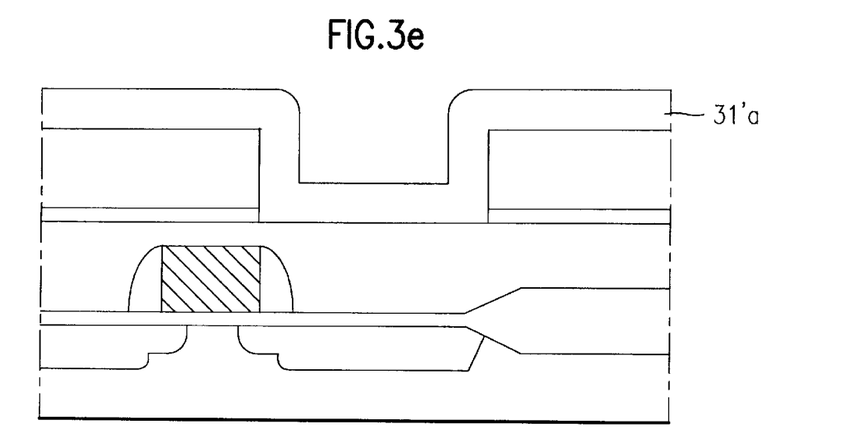
Figure 3F:
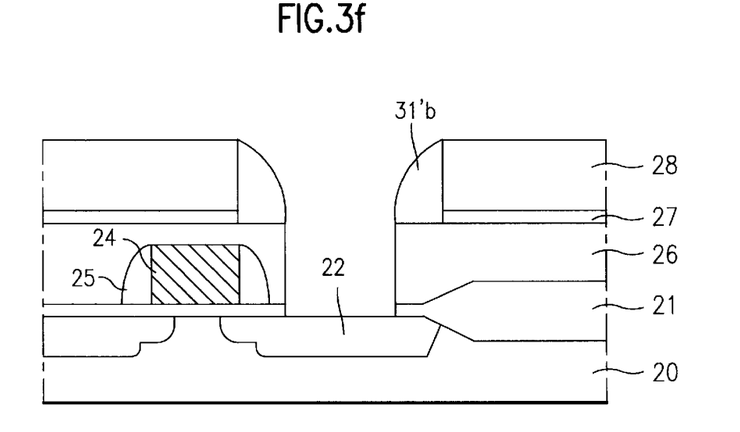
Figure 3G:
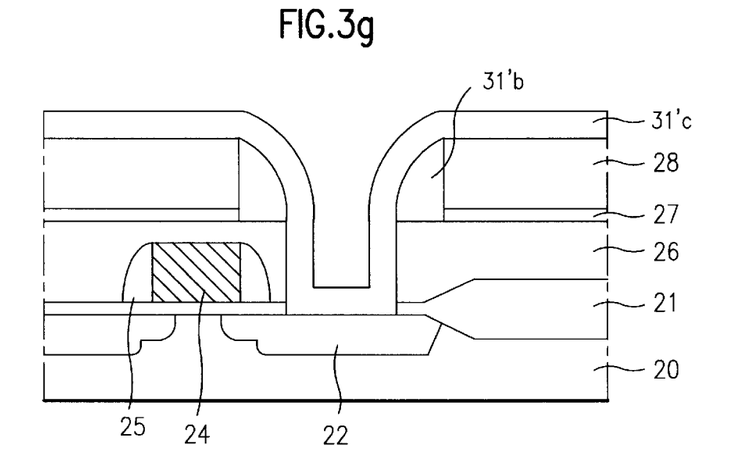
Figure 3H:
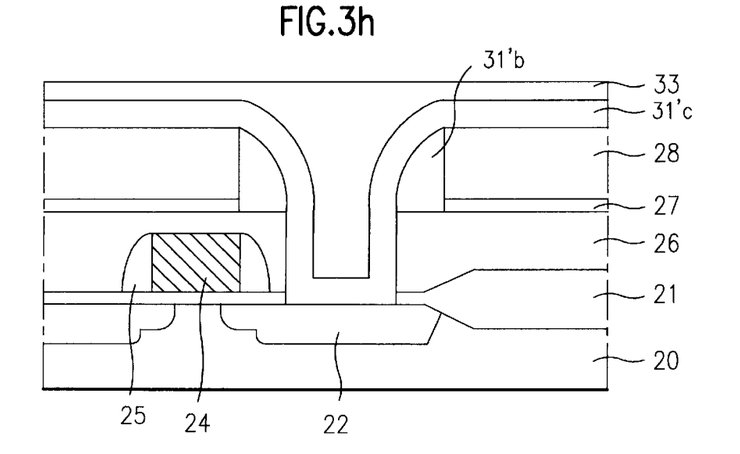
Figure 3I:
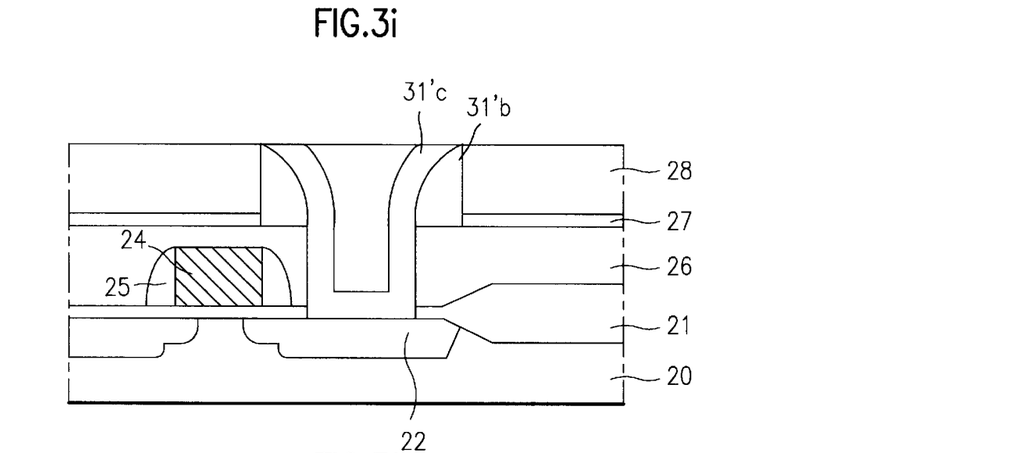
Figure 3J:
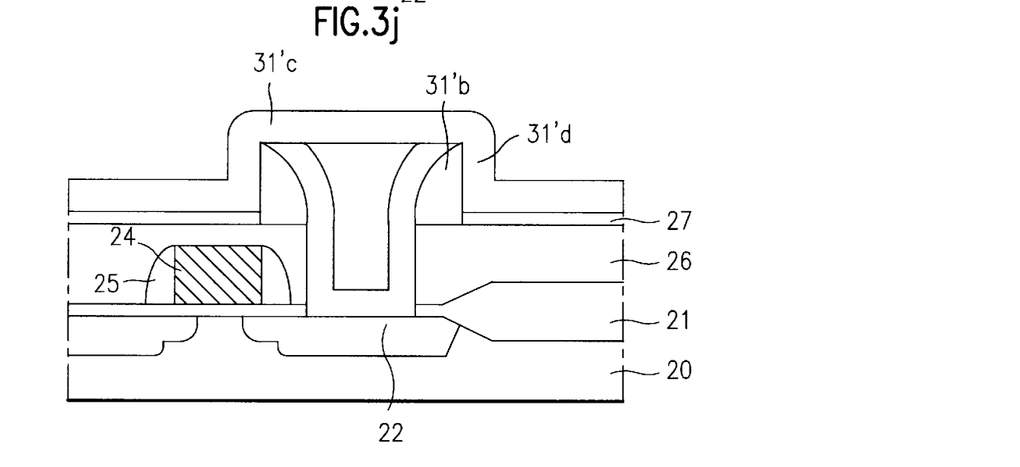
Figure 3K:
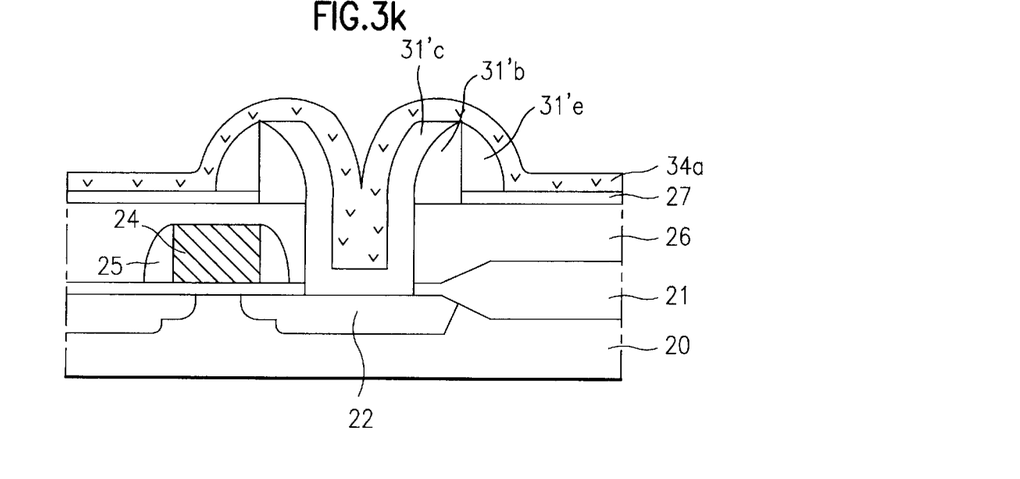
Figure 3L:
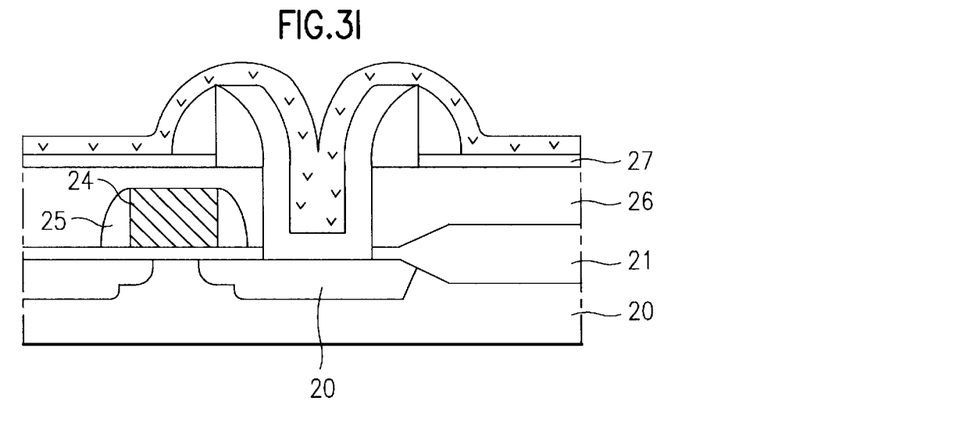
Figure 3M:
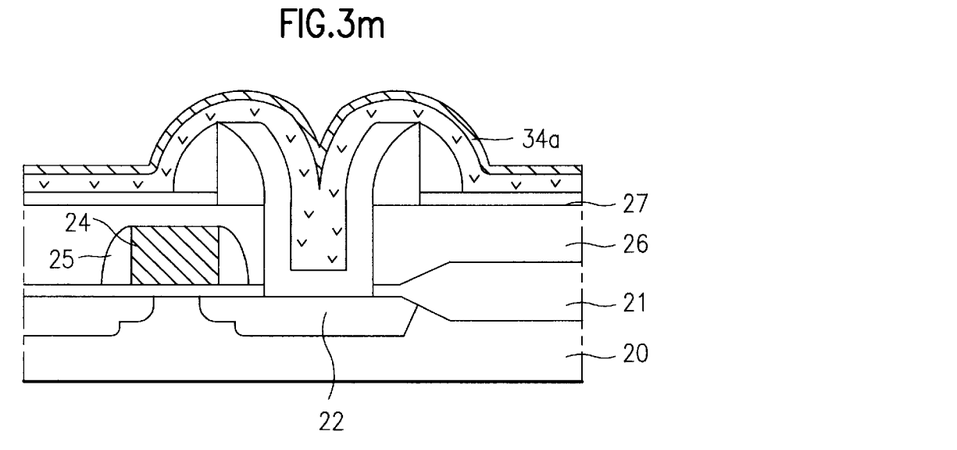
Figure 3N:
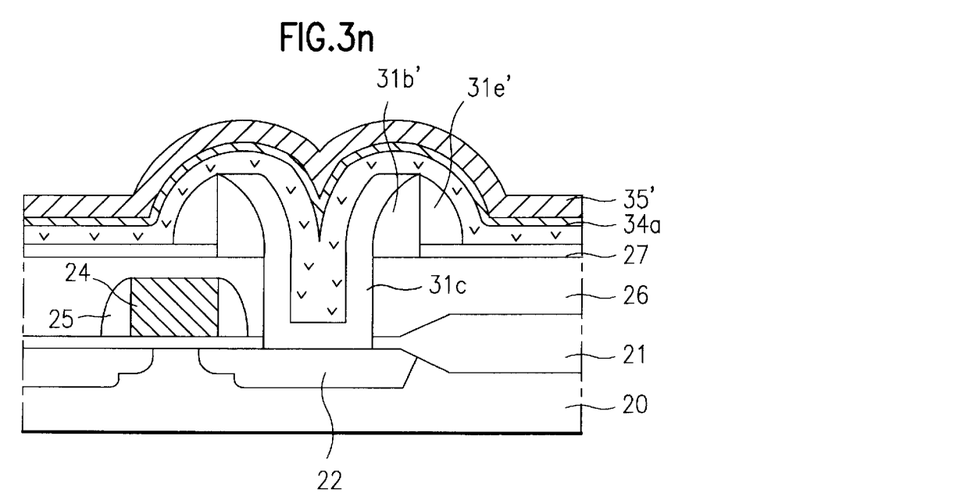

FIGS. 3a to 3n are cross-sectional views illustrating a method for manufacturing a capacitor having a high dielectric film, according to a second embodiment of the present invention.

In this second embodiment of the present invention, a dielectric layer is formed with an oxide-nitride (ON) structure.

Referring to FIG. 3n, in the capacitor according to the second embodiment of the present invention, a field oxide film 21 is formed on a device isolating region of a semiconductor substrate 20. A gate insulating film 23 and a gate electrode 24 are formed on an active region of semiconductor substrate 20. Impurity diffusion regions 22 having an LDD (lightly doped drain) structure are formed in the semiconductor substrate 20 on both sides of the gate electrode 24. A first insulating layer 26 having a contact hole on the impurity diffusing region 22 is formed to a thickness of about 3000 Å on the entire surface of the relevant region. A second insulating layer 27 is formed to a thickness of about 300 Å on the first insulating layer 26, with a wider expansion region than the contact hole. A first conductive sidewall 31b consisting of a polysilicon or an amorphous silicon is formed on the first insulating layer 26 of the expansion region. In the contact hole including the first conductive sidewall 31b, a second electrode material layer 31c consisting of a polysilicon is formed so as to be in contact with the impurity diffusion region 22. A second conductive sidewall 31e consisting of a polysilicon and having a predetermined width is formed on the second insulating layer 27 on the opposite side of the first conductive sidewall 31b. An oxide-nitride (ON) dielectric film 34a is formed on the entire surface including a lower electrode consisting of the first and second conductive sidewalls 31b and 31e and the second electrode material layer 31c. An upper electrode 35 consisting of a polysilicon is formed on the dielectric film 34 made of oxide-nitride (ON).

At this time, the first insulating layer 26 is formed of $SiO_2$ and the second insulating layer is formed of $Si_3N_4$.

The manufacturing process of the above capacitor having the high dielectric film of the present invention is as follows.

To begin with, as shown in FIG. 3a, a gate electrode 24 and a gate sidewall 25 are formed on a gate insulating film 23 on a semiconductor substrate 20 in which a field oxide film 21 is formed at a device isolating region. Impurity diffusion regions 22 having an LDD (lightly doped drain) structure are formed in the semiconductor substrate 20 on both sides of the gate electrode 24.

As shown in FIG. 3b, a first insulating layer 26 is formed to a thickness of about 3000 Å on the entire surface of the relevant region, through a chemical vapor deposition (CVD) process. According to a low pressure chemical vapor deposition (LPCVD) process, $Si_3N_4$ is deposited to a thickness of about 300 Å on the first insulating layer 26, thereby forming a second insulating layer 27.

As shown in FIG. 3c, $SiO_2$ is coated to a thickness of about 4000 Å through a chemical vapor deposition (CVD) process, thereby forming a third insulating layer 28. According to a low pressure chemical vapor deposition (LPCVD) process, $Si_3N_4$ is deposited to a thickness of about 300 Å on third insulating layer 28, thereby forming a fourth insulating layer 29.

Then, a photoresist 30 is coated on the fourth insulating layer 29 and patterned, thereby defining a region where a storage node electrode of a capacitor will be formed.

As shown in FIG. 3d, using the patterned photoresist 30 as a mask, the fourth insulating layer 29, the third insulating layer 28, and the second insulating layer 27, are sequentially etched through a reactive ion etching (RIE) process using $CHF_3/CF_4$, thereby forming a contact hole. Then, the photoresist 30 is doped in $H_2O_2/H_2SO_4$ solution and, thus, removed.

As shown in FIG. 3e, a polysilicon or an amorphous silicon is deposited to a predetermined thickness on the entire surface of the capacitor region, thereby forming a first electrode material layer 31'a.

As shown in FIG. 3f, the first electrode material layer 31a is anisotropically etched so as to be left only on the wall of the contact hole formed in the preceding process, thereby forming a first conductive sidewall 31'b.

Using the first conductive sidewall 31'b as a mask, the exposed first insulating layer 26 and the gate insulating film 23 are removed.

At this time, the etching process is carried out through an inductively coupled plasma (ICP) method using a gas having a high carbon content such as $C_2F_6$ or $C_3H_8$, and having a good etch selectivity with respect to the $SiO_2$ used as the first insulating layer 26 and the $Si_3N_4$ used as the second and fourth insulating layers 27 and 29.

As shown in FIG. 3g, a polysilicon is deposited thinly (for example, thinner than the first electrode material layer) on the entire surface of the capacitor region, thereby forming a second electrode material layer 31'c.

As shown in FIG. 3h, spin on glass (SOG) or a photoresist is coated on the entire surface of the semiconductor substrate 20, thereby forming a planarizing layer 33.

As shown in FIG. 3i, through a chemical mechanical polishing (CMP) process or a reactive in etching (RIE) process, the planarizing layer 33 is etched back until the second electrode material layer 31'c is exposed. Then, through an additional etching process, the planarizing layer 33 is etched so as to expose third insulating layer 28.

At this time, in the case where the planarizing layer 33 is formed of spin on glass (SOG), the reactive ion etching (RIE) process is performed using $CHF_3/CF_4$. In the case where the planarizing layer 33 is formed of a photoresist, plasma etching using $O_2/Ar$ is carried out.

According to the above etching process, the spin on glass (SOG) or the photoresist is coated in the contact hole where the storage node electrode of the capacitor will be formed. The second electrode material layer 31'c is removed from the regions other than the aforementioned region.

As shown in FIG. 3j, a polysilicon or an amorphous silicon is deposited to a predetermined thickness on the entire surface of the capacitor region, thereby forming a third electrode material layer 31'd.

As shown in FIG. 3k, the third electrode material layer 31'd is anisotropically etched to form a second conductive sidewall 31'e on the side of the first conductive sidewall 31b, thereby completing a lower electrode of the capacitor.

As shown in FIGS. 3*l* and 3*m*, the planarizing layer 33 consisting of the spin on glass (SOG) or the photoresist left in the contact hole is removed. $Si_3N_4$ is deposited and oxidized on the entire surface of the relevant region, thereby forming an oxide-nitride (ON) dielectric film 34*a*.

As shown in FIG. 3*n*, a polysilicon or an amorphous silicon is deposited on the oxide-nitride (ON) dielectric film 34*a*, thereby forming an upper electrode 35' of the capacitor.

The capacitor structure of a semiconductor device according to the present invention and a method for manufacturing the same have the following advantages. First, the electrode of the capacitor is formed of a half ring type structure having a constant angle slope (with a hemispherical cross-sectional shape), thereby increasing the rear electrode region. In addition, the fragile part causing the generation of the leakage current does not exist, thereby improving the electrical characteristics and reliability of the capacitor.

Second, since the capacitor can be formed using a single mask process, the manufacturing cost of the device can be reduced.

Third, since the contact hole connecting the semiconductor substrate with the lower electrode is self-aligned, inferior effects on the device caused by mis-alignment are reduced, thereby improving the reliability of the related process.

It will be apparent to those skilled in the art that various modifications and variations can be made in the capacitor structure of semiconductor device and the method for manufacturing the same of the present invention without departing from the spirit or scope of the invention. Thus, it is intended that the present invention cover the modifications and variations of this invention provided they come within the scope of the appended claims and their equivalents.

What is claimed is:

1. A capacitor structure of a semiconductor device, the capacitor structure comprising:

a semiconductor substrate having an impurity diffusion region;

an insulating layer on the semiconductor substrate and having a contact hole on the impurity diffusion region;

a first lower electrode having a hemispherical shape in a cross-sectional view perpendicular to the semiconductor substrate on the insulating layer along an upper edge of the contact hole;

a barrier metal layer on the first lower electrode and in the contact hole;

a second lower electrode on the barrier metal layer, wherein the first and second lower electrodes are not directly in contact with each other;

a dielectric layer on the first and second lower electrodes; and an upper electrode on the dielectric layer.

2. The capacitor structure as claimed in claim 1, wherein the insulating layer comprises first and second insulating layers formed of materials having a different etching rate from one another.

3. The capacitor structure as claimed in claim 2, wherein the first insulating layer is formed to a thickness of 3000 Å(±200 Å) by using $SiO_2$.

4. The capacitor structure as claimed in claim 2, wherein the second insulating layer is formed to a thickness of 300 Å(±20 Å) by using $Si_3N_4$.

5. The capacitor structure as claimed in claim 1, wherein the upper and lower electrodes are comprised of platinum (Pt).

6. The capacitor structure as claimed in claim 1, wherein the upper and lower electrodes are comprised of $RuO_2$.

7. The capacitor structure as claimed 1, wherein the barrier metal layer is in contact with the impurity diffusion region.

8. The capacitor structure as claimed in claim 7, wherein the barrier metal layer is comprised of TiN.

9. The capacitor structure as claimed in claim 1, wherein the upper and lower electrodes are comprised of polysilicon.

10. The capacitor structure as claimed in claim 5, wherein the dielectric layer is comprised of a material having a high dielectric constant.

11. The capacitor structure as claimed in claim 6, wherein the dielectric layer is comprised of a material having a high dielectric constant.

12. The capacitor structure as claimed in claim 9, wherein the dielectric layer is formed of an oxide-nitride (ON) structure.

13. The capacitor structure as claimed in claim 1, wherein the first lower electrode comprises first and second conductive sidewalls.

14. The capacitor structure as claimed in claim 13, wherein the first and second conductive sidewalls directly contact each other.

15. The capacitor structure as claimed in claim 13, wherein the first and second conductive sidewalls have different heights.

* * * * *